(12) United States Patent
Sato et al.

(10) Patent No.: US 7,602,588 B2
(45) Date of Patent: Oct. 13, 2009

(54) MAGNETIC SENSOR USING A MAGNETIC OSCILLATION ELEMENT

(75) Inventors: Rie Sato, Yokohama (JP); Kiwamu Kudo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 301 days.

(21) Appl. No.: 11/387,900

(22) Filed: Mar. 24, 2006

(65) Prior Publication Data

US 2006/0221507 A1    Oct. 5, 2006

(30) Foreign Application Priority Data

Mar. 31, 2005    (JP)    ............... 2005-104470

(51) Int. Cl.
*G11B 5/33*    (2006.01)

(52) U.S. Cl. ..................................... 360/324

(58) Field of Classification Search ................ None
See application file for complete search history.

(56) References Cited

U.S. PATENT DOCUMENTS

| | | | |
|---|---|---|---|
| 6,975,110 B2* | 12/2005 | Kaiju et al. | ................ 324/252 |
| 2005/0024788 A1* | 2/2005 | Sato et al. | .................. 360/324 |
| 2005/0219771 A1* | 10/2005 | Sato et al. | ............... 360/324.2 |
| 2006/0039089 A1* | 2/2006 | Sato | ......................... 360/324 |

FOREIGN PATENT DOCUMENTS

| | | |
|---|---|---|
| JP | 60-129624 | 7/1985 |
| JP | 4-312322 | 11/1992 |
| JP | 2005-39208 | 2/2005 |

OTHER PUBLICATIONS

S. I. Kiselev, et al., "Microwave oscillations of a nanomagnet driven by a spin-polarized current", Nature , vol. 425, Sep. 25, 2003, pp. 380-383.

L. Berger, "Emission of spin waves by a magnetic multilayer traversed by a current", Physical Review B, vol. 54, No. 13, Oct. 1, 1996, pp. 9353-9358.

* cited by examiner

*Primary Examiner*—David D Davis
(74) *Attorney, Agent, or Firm*—Oblon, Spivak, McClelland, Maier & Neustadt, L.L.P.

(57) ABSTRACT

A magnetic sensor has a magnetic oscillation element including a first magnetic resonance layer, a second magnetic resonance layer, a nonmagnetic layer sandwiched between the first and second magnetic resonance layers, and a pair of electrodes which supply a current perpendicularly to planes of the first resonance layer, the nonmagnetic layer and the second magnetic resonance layer, and a monitor monitoring a change dependent on an external magnetic field in a change of a high-frequency oscillation voltage generated across the magnetic oscillation element due to precession of magnetization in at least one of the first and second magnetic resonance layers caused by supplying the current.

11 Claims, 8 Drawing Sheets

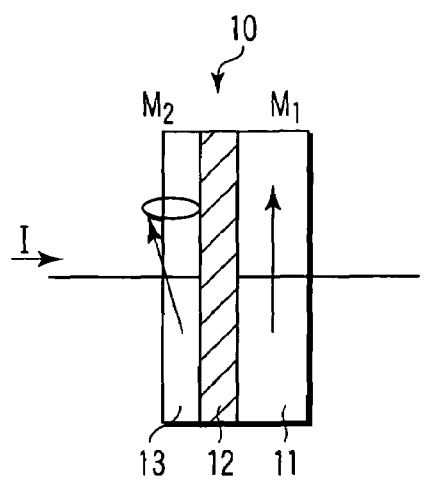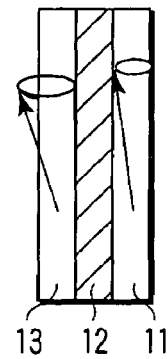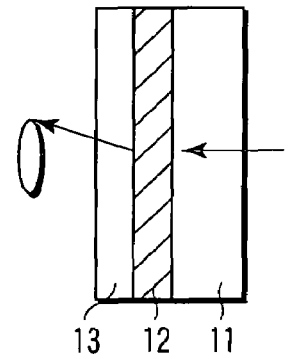
FIG. 2A  FIG. 2B  FIG. 2C
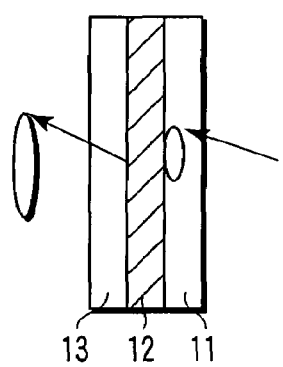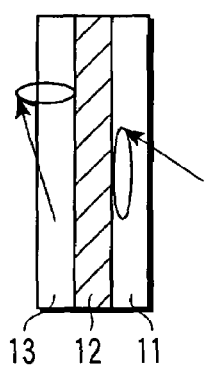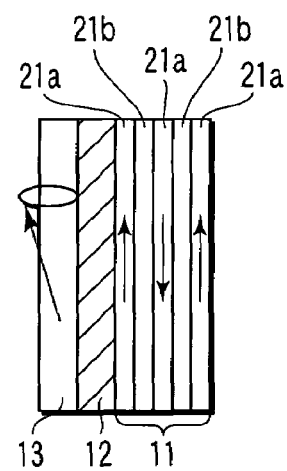
FIG. 2D  FIG. 2E  FIG. 2F
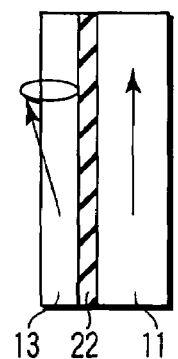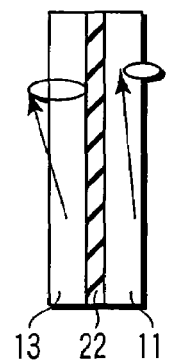
FIG. 2G  FIG. 2H

MAGNETIC SENSOR USING A MAGNETIC OSCILLATION ELEMENT

CROSS-REFERENCE TO RELATED APPLICATIONS

This application is based upon and claims the benefit of priority from prior Japanese Patent Application No. 2005-104470, filed Mar. 31, 2005, the entire contents of which are incorporated herein by reference.

BACKGROUND OF THE INVENTION

1. Field of the Invention

The present invention relates to a magnetic sensor and a magnetic recording and reproducing apparatus having a magnetic head including the magnetic sensor.

2. Description of the Related Art

Magnetic recording density has increased significantly since the advent of a giant magnetoresistive head (GMR head) that utilizes a giant magnetoresistive effect (GMR effect). A GMR element includes a stacked film (what is called a spin valve film) having a sandwich structure comprising a ferromagnetic layer, a nonmagnetic layer, and a ferromagnetic layer. The GMR element applies an exchange bias to one of the ferromagnetic layers to fix magnetization thereof, while allowing the magnetization direction of the other ferromagnetic layer to be changed by an external field. The GMR element thus detects a change in the relative angle between the magnetization directions of the two ferromagnetic layers, as a change in resistance value. A CIP-GMR element and a CPP-GMR element have been developed so far: the CIP-GMR element allows a current to flow in the plane of the spin valve film to detect a change in resistance; the CPP-GMR element allows a current to flow perpendicularly to the plane of the spin valve film to detect a change in resistance. Both CIP-GMR and CPP-GMR elements can provide a magnetoresistive ratio (MR ratio) of several percents. Thus, both elements are expected to achieve a recording density of up to about 200 Gbit/inch$^2$.

Efforts have been made to develop a TMR element that utilizes a tunnel magnetoresistive effect (TMR effect), in order to achieve higher magnetic recording density. The TMR element includes a stacked film comprising a ferromagnetic layer, an insulating layer, and a ferromagnetic layer. The TMR element applies a voltage to between the ferromagnetic layers to allow a tunnel current to pass through the insulating layer. The TMR element detects a change in relative magnetization angle as a change in tunnel resistance value on the basis of a change in the magnitude of the tunnel current associated with the magnetization directions in the upper and lower ferromagnetic layers. The TMR element can provide an MR ratio of up to about 100%. The TMR element has a higher MR ratio than the GMR element and thus offers a high signal voltage. However, the TMR element provides not only a high level of real signal component but also a high level of noise component resulting from shot noise. Thus, the TMR element disadvantageously fails to achieve a high signal-to-noise ratio (SNR). The shot noise is caused by fluctuation of a current resulting from the irregular passage of electrons through a tunnel barrier and increases in proportion to the square root of tunnel resistance. In order to obtain a required signal voltage while suppressing the shot noise, the tunnel insulating layer should be made thinner to reduce the tunnel resistance. The element needs to be as small as a recording bit in order to deal with an increased recording density. It is thus necessary to reduce a junction resistance or a thickness of the tunnel insulating layer. With a recording density of 300 Gbit/inch$^2$, the junction resistance needs to be at most 1 Ω·cm$^2$. For an Al—O (aluminum oxide) or an Mg—O (magnesium oxide) tunnel insulating layer, the film thickness must be equal to two atomic layers. A thinner tunnel insulating layer is likely to short the circuit between the upper and lower ferromagnetic layers, thus lowering the MR ratio. This makes it markedly difficult to produce a reliable element. This is why the limit on the recording density achievable with the TMR element would be estimated at about 300 Gbit/inch$^2$.

All the above elements utilize the magnetoresistive effect (MR effect) in a broad sense. In recent years, magnetic white noise has been a problem for all these MR elements. In contrast to electric noise such as the shot noise described above, the magnetic white noise is caused by thermal fluctuation of microscopic magnetization. The magnetic white noise thus becomes predominant as the size of the MR element is reduced. The magnetic white noise is expected to be more marked than the electric noise in elements that can achieve a recording density of 200 to 300 Gbpsi. To avoid the magnetic white noise and to further improve the magnetic recording density, a novel magnetic sensor needs to be developed which operates on the basis of a principle different from the one for the conventional elements.

On the other hand, a spin-wave oscillator has been proposed which is an example of applying motion of magnetization which occurs when a current flows perpendicularly to the plane of a three-layer structure comprising a first ferromagnetic layer, a nonmagnetic layer, and a second ferromagnetic layer (see Physical Review B. Volume 54, 9353 (1996)). The first ferromagnetic layer has magnetization pinned in a certain direction. Magnetization can rotate freely in the second ferromagnetic layer. When a current is supplied perpendicularly to the film plane, electrons flowing through the first ferromagnetic layer are spin-polarized. The resultant spin-polarized current is injected into the second ferromagnetic layer. The spins of the electrons interact with the magnetization in the second ferromagnetic layer to excite a spin wave. However, no technique for applying such a spin-wave oscillator to a magnetic sensor or the like is known.

BRIEF SUMMARY OF THE INVENTION

A magnetic sensor according to one embodiment of the present invention includes a magnetic oscillation element including a first magnetic resonance layer, a second magnetic resonance layer, a nonmagnetic layer sandwiched between the first and second magnetic resonance layers, and a pair of electrodes which supply a current perpendicularly to planes of the first resonance layer, the nonmagnetic layer and the second magnetic resonance layer. Further the magnetic sensor includes a monitor that monitors a change caused by an external magnetic field by determining a change in a high-frequency oscillation voltage generated across the magnetic oscillation element due to precession of magnetization in at least one of the first and second magnetic resonance layers caused by supplying the current.

A magnetic recording and reproducing apparatus according to another embodiment of the present invention includes a magnetic head having the above noted magnetic sensor and a magnetic recording medium.

BRIEF DESCRIPTION OF THE SEVERAL VIEWS OF THE DRAWING

FIGS. 2A, 2B, 2C, 2D, 2E, 2F, 2G, and 2H are sectional views showing examples of magnetic oscillation elements according to embodiments of the present invention;

DETAILED DESCRIPTION OF THE INVENTION

Embodiments of the present invention will be described below with reference to the drawings.

Figure 1:
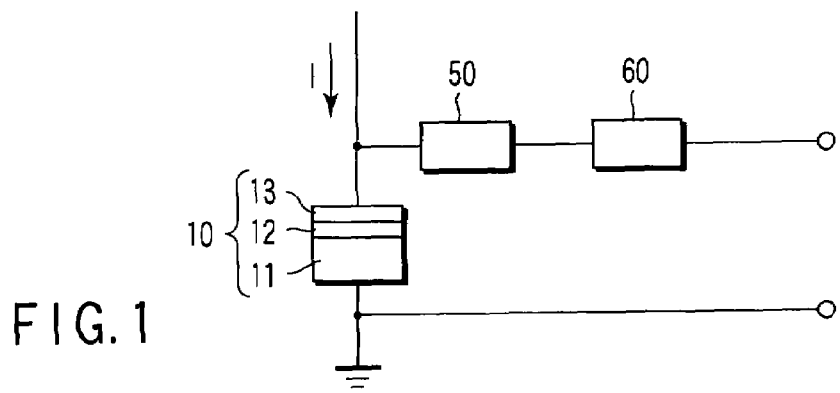
FIG. 1 is a diagram showing the configuration of a magnetic sensor according to an embodiment of the present invention.

First, the basic configuration of a magnetic sensor according to an embodiment of the present invention will be described. FIG. 1 is a diagram of the configuration of a magnetic sensor according to the embodiment of the present invention. The magnetic sensor comprises a magnetic oscillation element 10 includes a structure in which a first magnetic resonance layer 11, a nonmagnetic metal layer 12, and a second magnetic resonance layer 13 are stacked, and a high-frequency filter 50 and an integrating circuit 60 which constitute monitor monitoring a high-frequency oscillation voltage generated across the magnetic oscillation element 10.

The magnetic resonance element 10 utilizes spin transfer torque. As shown in FIGS. 2A, 2B, 2C, 2D, 2E, 2F, 2G, and 2H, various types of the magnetic oscillation element 10 can be used.

The magnetic oscillation element 10 in FIG. 2A includes a structure in which the first magnetic resonance layer 11, nonmagnetic metal layer 12, and second magnetic resonance layer 13 are stacked. The first magnetic resonance layer 11 and the second magnetic resonance layer 13 in FIG. 2A have in-plane magnetic anisotropy. Here, magnetization in the first magnetic resonance layer 11 is set to M1, and magnetization in the second magnetic resonance layer 13 is set to M2. In this example, the magnetization M1 in the first magnetic resonance layer 11 is substantially pinned, and the magnetization M2 in the second magnetic resonance layer 13 is not pinned. As shown in FIG. 2A, when a current I is passed through the first magnetic resonance layer 11, nonmagnetic metal layer 12 and second magnetic resonance layer 13 perpendicularly to the film planes, static spin transfer torque by the substantially pinned magnetization M1 in the first magnetic resonance layer 11 acts on the magnetization M2 in the second magnetic resonance layer 13 through the nonmagnetic metal layer 12 and excites precession of the magnetization M2. Since the precession is affected by an external field, the external field can be detected by detecting a change dependent on the external field in the amplitude, phase or oscillation frequency of a high-frequency voltage associated with the frequency of the precession.

In the magnetic oscillation element in FIG. 2B, either of the magnetizations (M1 and M2) in the first and second magnetic resonance layers 11 and 13 are not pinned. The spin transfer torque acting between the two magnetic resonance layers 11 and 13 excites precessions in the two magnetizations M1 and M2 simultaneously with a specific phase difference. It is preferable to establish the following conditions in order to simultaneously excite the precessions. If the magnetic resonance frequency of the first magnetic resonance layer 11 is set to $f_1$ and the magnetic resonance frequency of the second magnetic resonance layer 13 is set to $f_2$, the difference ($f_2-f_1$) between the two magnetic resonance frequencies should be larger than the half of the resonance line width (a full width at half maximum of the resonance absorption peak) of the first magnetic resonance layer 11, and the ratio $f_2/f_1$ of the two magnetic resonance frequencies should be at most 1.6, more preferably at most 1.4. When the two magnetic resonance frequencies $f_1$ and $f_2$ do not meet these conditions, it is difficult to excite the precessions simultaneously. The magnetic oscillation element in FIG. 2B can provide more stable oscillation at a lower current compared to the case of the magnetic oscillation element in FIG. 2A.

The magnetic oscillation elements in FIGS. 2C and 2D use perpendicular magnetization films as the first and second magnetic resonance layers 11 and 13. In FIG. 2C, the magnetization in the first magnetic resonance layer 11 is substantially pinned, while the magnetization in the second magnetic resonance layer 13 is not pinned. In FIG. 2D, neither of the magnetizations in the first and second magnetic resonance layers 11 and 13 is pinned. In the magnetic oscillation element in FIG. 2C or 2D, the precession of magnetization has a circular locus. This enables an isotropic oscillating field to be generated in the film plane.

The magnetic oscillation element in FIG. 2E is a modification of the magnetic oscillation element in FIG. 2B in which the first magnetic resonance layer 11 is formed of a perpendicular magnetization film. The magnetic oscillation element in FIG. 2F is another modification of the magnetic oscillation element in FIG. 2B in which the first magnetic resonance layer 11 is formed of an antiferromagnetically coupled layer comprising a stack of a ferromagnetic layer 21a, a nonmagnetic metal layer 21b, a ferromagnetic layer 21a, a nonmagnetic metal layer 21b, and a ferromagnetic layer 21a. The magnetic oscillation elements in FIGS. 2E and 2F exhibit oscillation frequencies with low external-field dependency.

The magnetic oscillation elements in FIGS. 2G and 2H are variations of the magnetic oscillation elements in FIGS. 2A and 2B, respectively, in which the nonmagnetic metal layer 12 is replaced with a tunnel insulating film 22. The magnetic oscillation elements in FIGS. 2G and 2H advantageously allow their output voltages to be improved. However, since such a magnetic oscillation element has poor impedance matching with a high-frequency circuit as described later, a magnetic sensor including the magnetic oscillation element would be often required to provide with an on-chip FET (field effect transistor).

A pair of bias magnetic films may be provided on both sides of at least one of the first and second magnetic resonance layers formed of a ferromagnetic layer with in-plane magnetic anisotropy. One of the first and second magnetic resonance layers may be formed of an exchange-coupled film in which a ferromagnetic layer with in-plane magnetic anisotropy and an antiferromagnetic layer are stacked. One of the first and second magnetic resonance layers may be formed of an exchange-coupled film in which a ferromagnetic layer with in-plane magnetic anisotropy, a nonmagnetic intermediate layer for adjusting a magnitude of an exchange bias field, and an antiferromagnetic layer are stacked.

Any of the magnetic oscillation elements shown in FIGS. 2A to 2H provides a high-frequency oscillation output associated with the frequency of the precession of magnetization in at least one of the first and second magnetic resonance layers 11 and 13 in the configuration in FIG. 1, for example. The high-frequency oscillation output varies dependent on the external field.

Figure 3A:
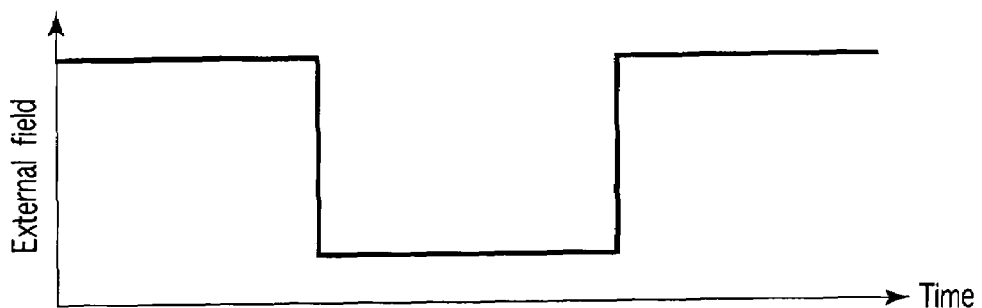
FIGS. 3A, 3B, and 3C are diagrams showing change with time in external field, high-frequency oscillation voltage, and signal voltage, respectively, in an embodiment of the present invention.
Figure 3B:
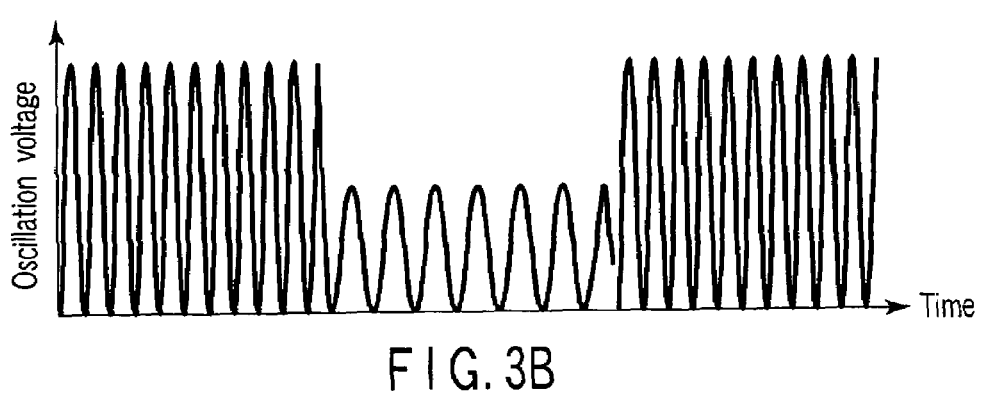
Figure 3C:
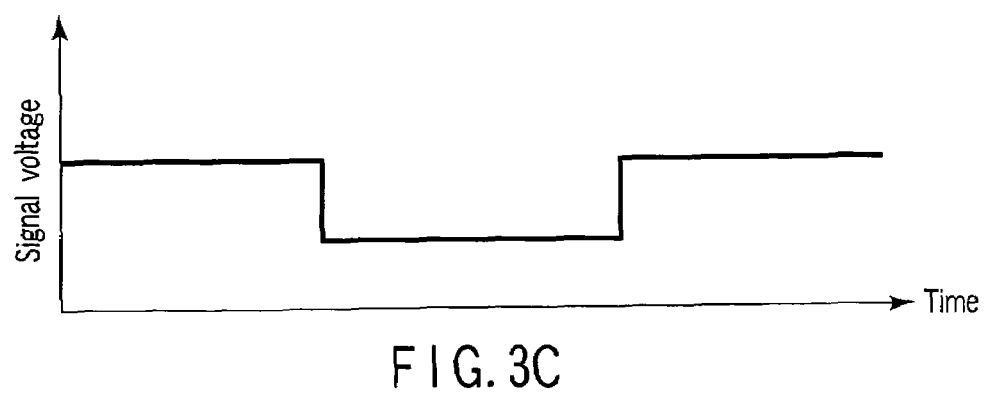

When an external field varies as shown in FIG. 3A, for example, the oscillation frequency and intensity of the high-frequency oscillation voltage vary dependent on the external field as shown in FIG. 3B. FIG. 3C shows a signal voltage obtained by smoothing the high-frequency oscillation voltage in FIG. 3B.

Figure 4A:
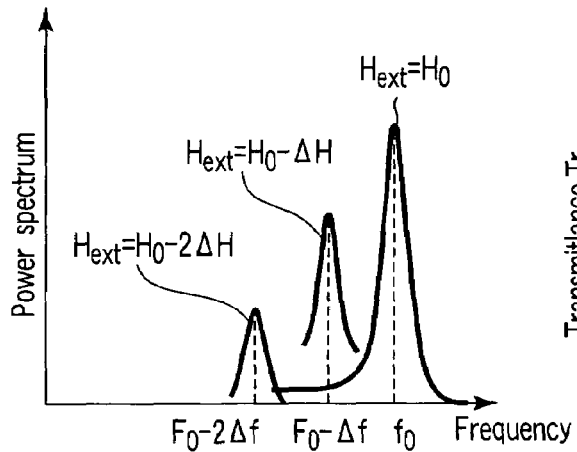
FIGS. 4A and 4B are diagrams showing an example of power spectrum of the high-frequency oscillation voltage and an example of the transmittance characteristics of a band-pass filter, respectively, in the embodiment of the present invention.

FIG. 4A shows an example of a power spectrum of the high-frequency oscillation voltage. For example, the power spectrum exhibits a peak at a frequency $f_0=2f_{res}$ that is double a magnetic resonance frequency of a magnetic resonance layer. If Fe is used as the material for the magnetic resonance layer, the magnetic resonance frequency $f_{res}$ is about 10 GHz. A variation in applied external field $H_{ext}$ varies the peak frequency. Oscillation conditions also vary dependent on $H_{ext}$, so that the intensity of the peak voltage varies according to $H_{ext}$. FIG. 4A shows the cases where the external field is varied by $\Delta H$ and $2\Delta H$. The peak width $\Delta f$ of the power spectrum is expressed as follows:

$$\Delta f = 4\alpha f_{res},$$

where $\alpha$ denotes the Gilbert's attenuation coefficient for the given magnetic material. The amplitude $V_{mag}$ of the oscillation voltage can be expressed as follows:

$$V_{mag} = \frac{1}{2} IR\left(\frac{\Delta R}{R}\right) \times \frac{\Delta \theta}{180}, \qquad (1)$$

where R denotes the resistance of the element, $\Delta R/R$ denotes a magnetoresistive ratio (MR ratio), and $\Delta \theta$ denotes the maximum angle between the two magnetizations. If the current value and bias field is optimized, the value of $\Delta \theta/180$ can be set at about 0.3 to 0.5, so that high voltage amplitude can be produced.

For example, in the magnetic oscillation element shown in FIG. 2A or 2B, if R is 50 Ω, the MR ratio is 10%, and $\Delta \theta/180$ is 0.5, then the amplitude $V_{mag}$ of the oscillation voltage will be about 1.25 mV under a condition that 1 mA of current I is passed through the element.

No detector is required to extract the signal voltage shown in FIG. 3C from the oscillation voltage shown in FIG. 3B. For example, an integrating circuit with an appropriate time constant may be used for this purpose.

Figure 4B:
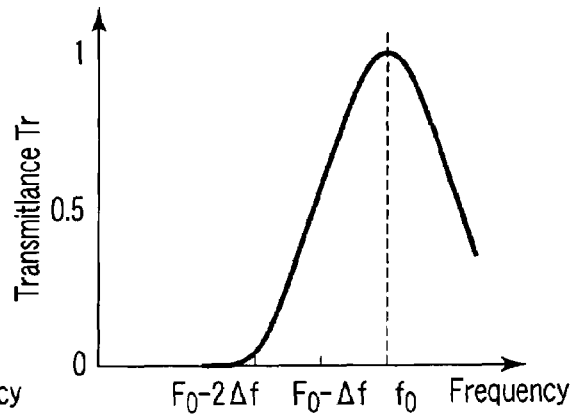
Figure 5A:
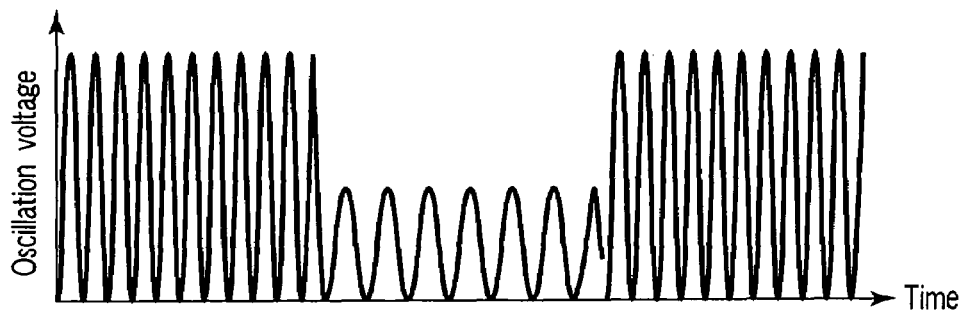
FIGS. 5A and 5B are diagrams showing change with time in high-frequency oscillation voltage and signal voltage, respectively, in the embodiment of the present invention.
Figure 5B:
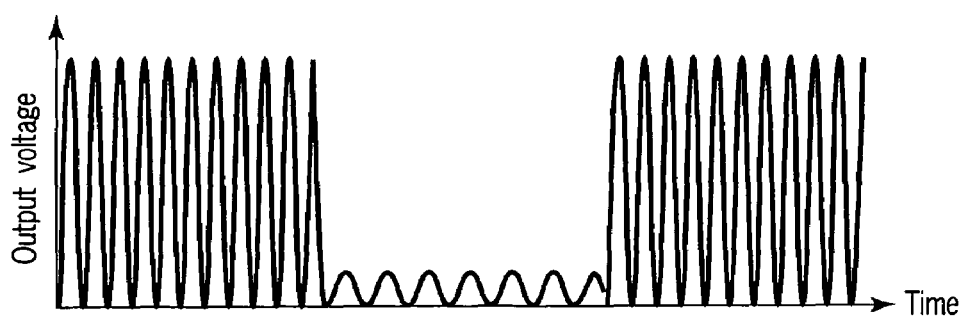

Since the external field varies the oscillation frequency as shown in FIGS. 3B and 4, a high-frequency filter such as a band-pass filter can be effectively used with the element to enhance the signal intensity. For example, by using a band-pass filter exhibiting transmittance characteristics as shown in FIG. 4B, an output voltage as shown in FIG. 5B, with a high-frequency component the magnitude of which is increased relative to those of the other components, can be obtained from the oscillation voltage shown in FIG. 5A which corresponds to FIG. 3B.

The magnetic oscillation elements according to embodiments of the present invention cause electric noise such as Johnson noise or shot noise resulting from fluctuation of an electron current. The electric noise $v_{el}$ is known to be expressed as follows:

$$<v_{el}^2> = 2eVR\coth\left(\frac{eV}{2kT}\right)\Delta f. \qquad (2)$$

The electric noise is white noise independent of the frequency. For an applied voltage V of eV<<2 kT=50 mV, the equation corresponds to the Johnson noise. In contrast, for an applied voltage V of eV>>2 kT, the equation corresponds to the shot noise. $\Delta f$ denotes a bandwidth which may be the same as the peak width of the oscillation spectrum shown in FIG. 4A.

The magnetic sensor according to the embodiment of the present invention utilizes a change in the precession of magnetization caused by the external field. However, the electric noise expressed by Equation (2) which is independent of the external field may be a factor to degrade the SNR. In the case where a magnetic sensor uses the magnetic oscillation element shown in FIG. 2A or 2B, the magnetic sensor will provide SNR of about 20 to 30 (26 to 30 dB) calculated using the noise expressed by Equation (2).

Figure 6:
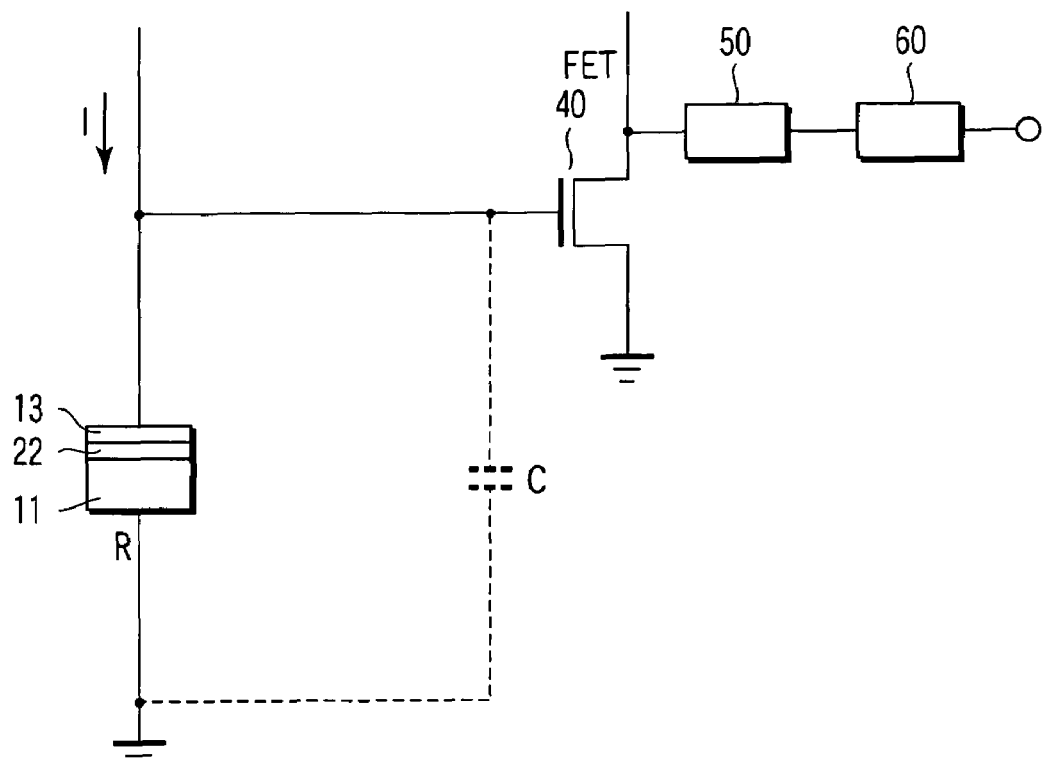
FIG. 6 is a diagram showing the configuration of a magnetic sensor including an on-chip FET according to another embodiment of the present invention.

As described above, since the magnetic oscillation element having the tunnel insulating layer 22 as shown in FIG. 2G or 2H has poor impedance matching with a high-frequency circuit, an on-chip FET is preferably introduced into a magnetic sensor including the magnetic oscillation element. FIG. 6 is a diagram showing the configuration of a magnetic sensor including an on-chip FET. The magnetic sensor comprises the magnetic oscillation element 10 including the structure that the first magnetic resonance layer 11, tunnel insulating layer 22, and second magnetic resonance layer 13 are stacked, and an FET 40, a high-frequency filter 50, and an integrating circuit 60 configured to monitor a high-frequency oscillation voltage generated across the magnetic oscillation element 10. In FIG. 6, an output terminal of the magnetic oscillation element 10 is directly connected to the gate of FET 40 having a high input resistance, without using a transmission line with low impedance. A capacitance C (=1 fF) in the figure corresponds to the gate capacitance of FET 40. In the magnetic oscillation element having the tunnel insulating layer 22 as shown in FIG. 2G or 2H, if R is 1 kΩ, the MR ratio is 20%, and $\Delta \theta/180$ is 0.5, then the amplitude $V_{mag}$ of the oscillation voltage is about 5 mV under a condition that 0.1 mA of current I is passed through the element. The amplitude value is larger than that of the magnetic sensor including the magnetic oscillation element shown in FIG. 2A or 2B described above. Since the magnetic sensor has a high resistance, it can maintain a high SNR of about 20 to 30 (26 to 30 dB).

The monitor in the magnetic sensor according to the embodiment of the present invention is not limited to the one shown in FIG. 1 or 6, if only the monitor can monitor the amplitude, phase, or oscillation frequency of a high-frequency oscillation voltage generated across the magnetic oscillation element 10 due to precession of the magnetization in at least one of the first and second magnetic resonance layers 11 and 13 caused by supplying a current. For example, a narrow-band amplifier may be used instead of the high-frequency filter 50. The integrating circuit 60 may be replaced with the stray capacitance of wiring.

Figure 7:
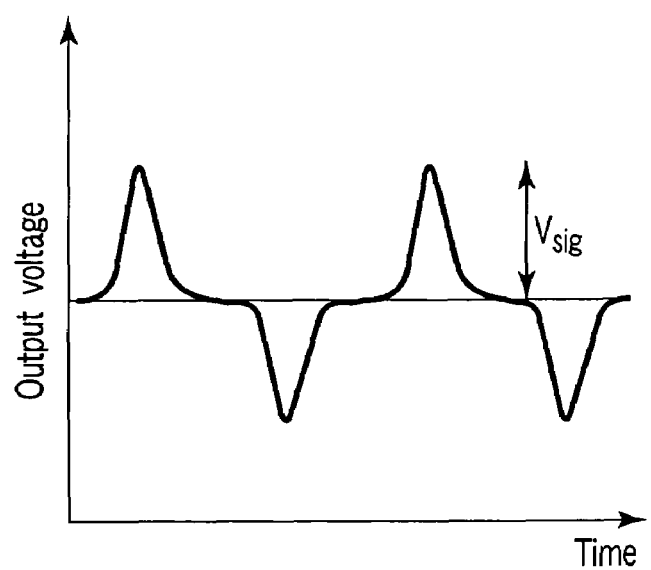
FIG. 7 is a diagram showing a read signal generated by a magnetic recording and reproducing apparatus according to still another embodiment of the present invention.

In a magnetic recording and reproducing apparatus in which the magnetic sensor according to the embodiment of the present invention is incorporated as a magnetic head, data written to the recording medium can be read by the magnetic head and such signals as schematically shown in FIG. 7 can be obtained.

The magnetic sensor according to the embodiment of the present invention prevents the sensitivity and SNR from being degraded even when the area of the magnetic oscillation element is reduced, as is apparent from its operational principle. Therefore, a read head to which the magnetic sensor is applied is expected to achieve a very high recording density of several hundred Gbpsi to over 1 Tbpsi.

EXAMPLES

Example 1

Figure 8A:
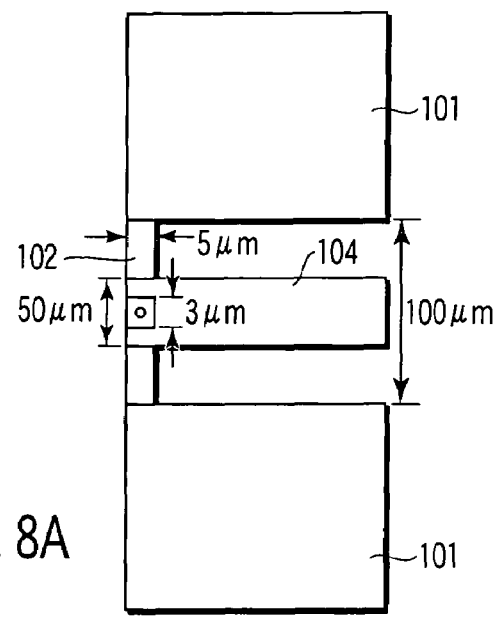
FIGS. 8A, 8B, and 8C are a plan and sectional view of a coplanar guide including a magnetic oscillation element fabricated in Example 1 and a detailed sectional view of a magnetic oscillation element, respectively.
Figure 8B:
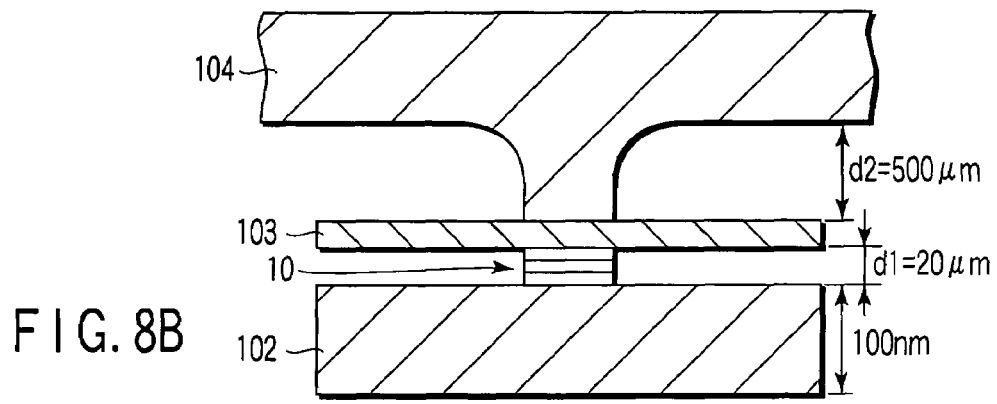
Figure 8C:
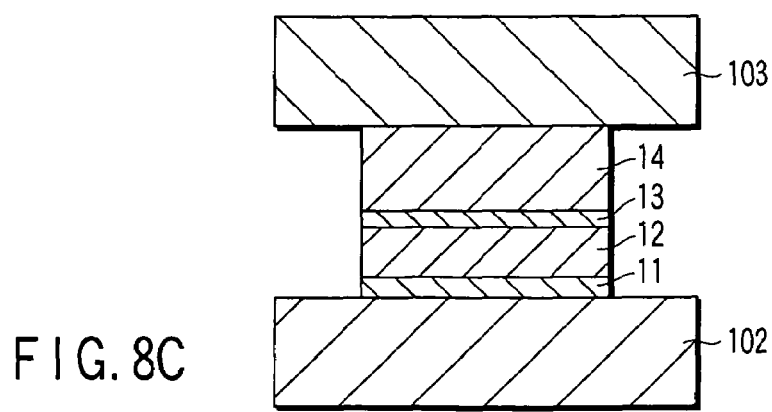

In the present example, a magnetic oscillation element is produced and oscillation characteristics thereof are measured. The example will be described below. FIG. 8A is a plan view of a coplanar guide including the magnetic oscillation element produced in the present example. FIG. 8B is a sectional view of FIG. 8A. FIG. 8C is a detailed sectional view of a magnetic oscillation element in FIG. 8B. The coplanar guide is produced by depositing a metal thin film on a sapphire substrate (not shown) by sputtering and processing the metal thin film by electron beam lithography.

As shown in FIGS. 8A and 8B, two ground plates 101, 101 spaced at a distance of 100 μm are connected at their ends by a Ru layer 102 with a width of 5 ρm and a thickness of 100 nm. The magnetic oscillation element 10, an Au layer 103 with a thickness of 100 nm, and a waveguide 104 are formed on the Ru layer 102. As shown in FIG. 8C, the magnetic oscillation element is formed of a stack of the Ru layer 102 with a thickness of 100 nm, the first magnetic oscillation layer 11 made of Co with a thickness of 2 nm, the nonmagnetic metal layer 12 made of Cu with a thickness of 5 nm, the second magnetic oscillation layer 13 made of Co with a thickness of 3 nm, a Cu layer 14 with a thickness of 10 nm, and an Au layer 103 with a thickness of 100 nm. The area of the junction is designed to be 120×80 $nm^2$. Uniaxial magnetic anisotropy is imparted to the first and second magnetic oscillation layers 11 and 13 through the step of depositing Co while applying a magnetic field of about 1,000 Oe. The magnetic oscillation element has an element resistance R of 40 Ω and an MR ratio (ΔR/R) of about 4.8%.

Figure 9:
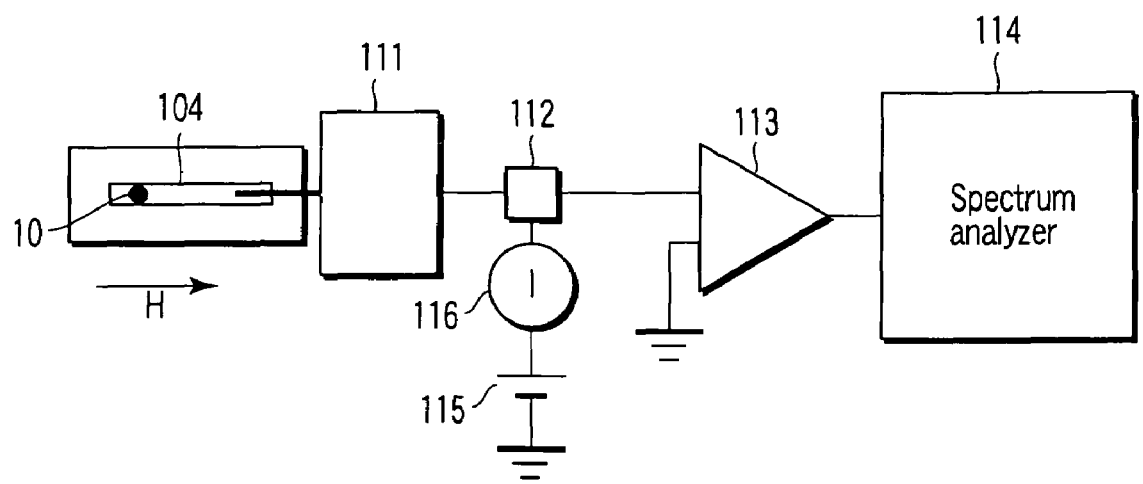
FIG. 9 is a diagram showing the configuration of a measurement system for oscillation power spectrum of the magnetic oscillation element in Example 1.

FIG. 9 shows a measurement system for measuring the oscillation power spectrum of the magnetic oscillation element. A bias tee 112 is connected via a prober 111 to the waveguide 104 (with a characteristic impedance of 50 Ω), through which high-frequency oscillation from the magnetic oscillation element 10 is transmitted. An input terminal of an amplifier 113 is connected to an output terminal of the bias tee 112. A spectrum analyzer 114 is connected to an output terminal of the amplifier 113. Also, a voltage source 115 and a current source 116 are connected to the bias tee 112.

The power spectrum of the high-frequency oscillation voltage of the magnetic oscillation element 10 is measured under the conditions that an external field H is applied to the element 10 in the direction of its in-plane easy axis of magnetization and a current of 1.5 mA is passed through the element 10 via the bias tee 112.

Figure 10:
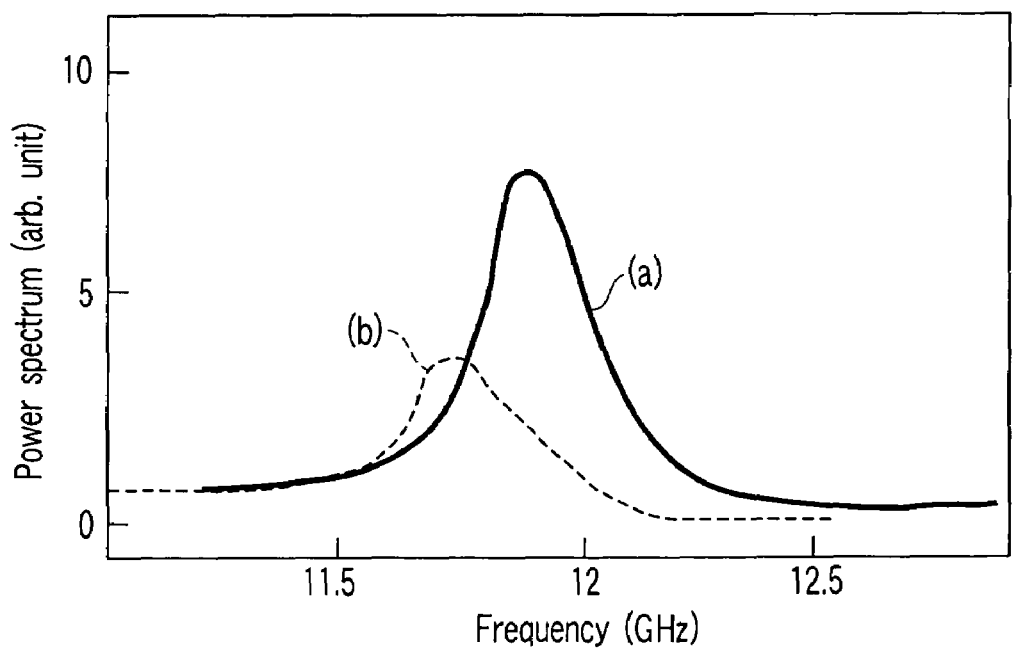
FIG. 10 is a diagram showing measurement results of the power spectrum in Example 1.

FIG. 10 shows measurement results of the power spectrum. A solid line (a) shows a spectrum obtained by applying an external field of 100 Oe to the magnetic oscillation element, and a dotted line (b) shows a spectrum obtained by applying an external field of 40 Oe to the magnetic oscillation element. FIG. 10 shows that a decrease in the intensity of the external field by 60 Oe reduces the intensity of the spectrum approximately to half and shifts the peak by about 0.2 GHz. The Gilbert's attenuation coefficient α estimated from the peak width of the spectrum is about 0.03.

Example 2

Figure 11A:
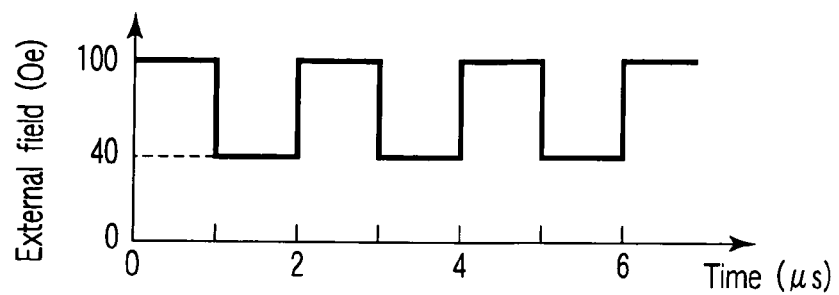
FIGS. 11A and 11B are diagrams showing a pulse field applied in Example 2 and a measurement result of a signal voltage, respectively.
Figure 11B:
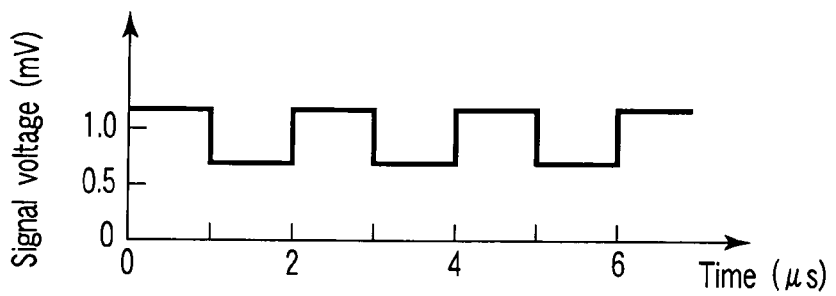

In the present example, measurement of a signal voltage will be described. An integrating circuit with a time constant of about 10 ns is connected to the magnetic oscillation element in place of the amplifier and spectrum analyzer in FIG. 9. A synchroscope is used to measure the output voltage (signal voltage) of the magnetic oscillation element with the pulse field shown in FIG. 11A applied to the element. FIG. 11B shows measurements of the signal voltage. As shown in FIG. 11B, a signal with an amplitude of 0.5 mV is obtained.

Example 3

Figure 12A:
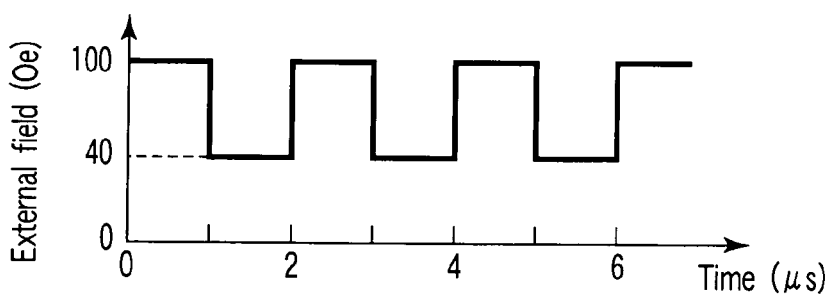
FIGS. 12A and 12B are diagrams showing a pulse field applied in Example 3 and a measurement result of a signal voltage, respectively.
Figure 12B:
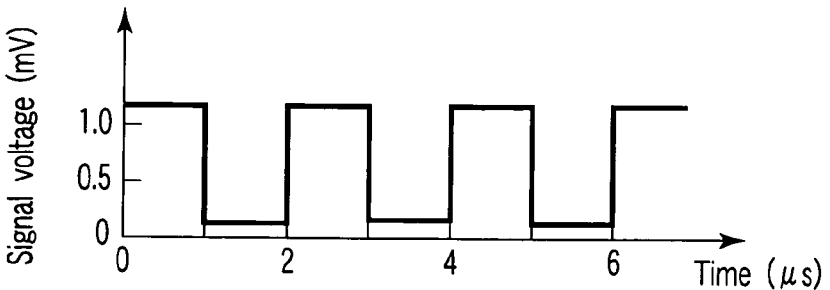

In the present example, measurement of a signal voltage obtained with a system in which a band-pass filter is added will be described. A Gaussian band-pass filter is interposed between the bias tee and the integrating circuit in the measurement system used in Example 2. The band-pass filter has a maximum transmittance of 98%, a center frequency of 11.9 GHz, and a full-width at half maximum of 0.5 GHz. As in the case of Example 2, a synchroscope is used to measure the output voltage (signal voltage) of the magnetic oscillation element with the pulse field shown in FIG. 12A applied to the element. FIG. 12B shows measurement of the signal voltage. As shown in FIG. 12B, the amplitude increases to about 1 mV.

Figure 13:
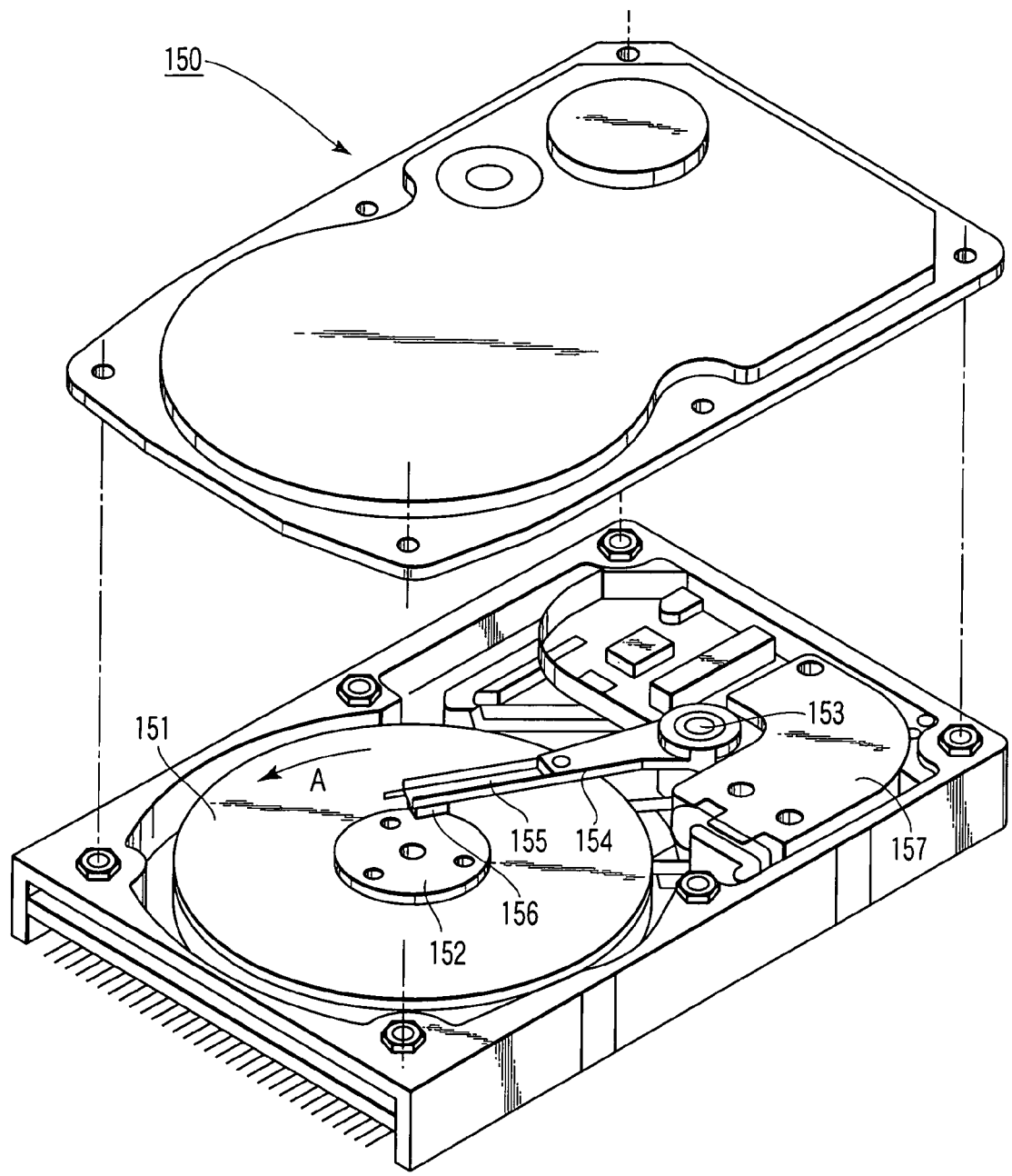
FIG. 13 is a perspective view of a magnetic recording and reproducing apparatus according to a further embodiment of the present invention.

FIG. 13 shows a perspective view of a magnetic recording and reproducing apparatus 150 according to an embodiment of the present invention. A magnetic disk (magnetic recording medium) 151 is mounted on a spindle 152 and rotated in the direction of arrow A by a spindle motor. An actuator arm 154 is attached to a pivot 153 provided near the magnetic disk 151. A suspension 155 is attached to the tip of the actuator arm 154. A head slider 156 is supported on a bottom surface of the suspension 155. A magnetic head including the above magnetic sensor is incorporated in the head slider 156. A voice coil motor 157 is formed at a proximal end of the actuator arm 154.

The magnetic disk 151 is rotated and the voice coil motor 157 rotatively moves the actuator arm 154 to load the head slider 156 above the magnetic disk 151. The air bearing surface (ABS) of the head slider 156 in which the magnetic head is incorporated is kept at a predetermined flying height from the surface of the magnetic disk 151. Data recorded on the magnetic disk 151 can then be read on the basis of the aforementioned principle.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic sensor comprising:
   a magnetic oscillation element including a first magnetic resonance layer, a second magnetic resonance layer, a nonmagnetic layer sandwiched between the first and second magnetic resonance layers, and a pair of electrodes which supply a current perpendicularly to planes of the first resonance layer, the nonmagnetic layer and the second magnetic resonance layer; and
   a monitor configured to monitor a change caused by an external magnetic field by determining a change in a high-frequency oscillation voltage generated across the magnetic oscillation element due to precession of magnetization in at least one of the first and second magnetic resonance layers caused by supplying the current.

2. The magnetic sensor according to claim 1, wherein the change in the high-frequency oscillation voltage is selected from the group consisting of an amplitude, phase and oscillation frequency of the high-frequency oscillation voltage.

3. The magnetic sensor according to claim 1, wherein each of the first and second magnetic resonance layers are formed of a ferromagnetic layer having in-plane magnetic anisotropy.

4. The magnetic sensor according to claim 1, wherein each of the first and second magnetic resonance layers are formed of a ferromagnetic layer having perpendicular magnetic anisotropy.

5. The magnetic sensor according to claim 1, wherein the first and second magnetic resonance layers are formed of a ferromagnetic layer having in-plane magnetic anisotropy and a ferromagnetic layer having perpendicular magnetic anisotropy, respectively.

6. The magnetic sensor according to claim 1, wherein at least one of the first and second magnetic resonance layers is formed of an antiferromagnetically coupled layer in which a plurality of ferromagnetic layers and a nonmagnetic intermediate layer are alternately stacked.

7. The magnetic sensor according to claim 1, wherein the nonmagnetic layer sandwiched between the first magnetic resonance layer and second magnetic resonance layer is a nonmagnetic metal layer or an insulating layer.

8. The magnetic sensor according to claim 7, further comprising a field effect transistor between the magnetic oscillation element and the high-frequency filter, a gate of which is connected to an output terminal of the magnetic oscillation element.

9. The magnetic sensor according to claim 1, wherein the monitor comprises a high-frequency filter through which a high-frequency component of a high-frequency oscillation voltage generated across the magnetic oscillation element is passed, and an integrating circuit.

10. A magnetic recording and reproducing apparatus comprising:
    a magnetic head including the magnetic sensor according to claim 1; and
    a magnetic recording medium.

11. A magnetic sensor comprising:
    a magnetic oscillation element including a first magnetic resonance layer, a second magnetic resonance layer, a nonmagnetic layer sandwiched between the first and second magnetic resonance layers, and a pair of electrodes which supply a current perpendicularly to planes of the first resonance layer, the nonmagnetic layer and the second magnetic resonance layer; and
    a monitor comprising a high-frequency filter, which passes a high-frequency component of a high-frequency oscillation voltage generated across the magnetic oscillation element due to precession of magnetization in at least one of the first and second magnetic resonance layers caused by supplying the current, and an integrating circuit, the monitor configured to monitor a change caused by an external magnetic field by determining a change in the high-frequency oscillation voltage.

* * * * *